US008616598B2

(12) United States Patent
Cadee et al.

(10) Patent No.: US 8,616,598 B2
(45) Date of Patent: Dec. 31, 2013

(54) APPARATUS AND METHOD FOR CONTACTLESS HANDLING OF AN OBJECT

(75) Inventors: Theodorus Petrus Maria Cadee, Vlierden (NL); Koen Jacobus Johannes Maria Zaal, Eindhoven (NL); Timo Hol, 's Gravenhage (NL); Michael Wilhelmus Theodorus Koot, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 361 days.

(21) Appl. No.: 13/081,919

(22) Filed: Apr. 7, 2011

(65) Prior Publication Data

US 2011/0280703 A1    Nov. 17, 2011

Related U.S. Application Data

(60) Provisional application No. 61/333,439, filed on May 11, 2010.

(51) Int. Cl.
    *B25J 15/06*    (2006.01)
(52) U.S. Cl.
    USPC .......................... 294/64.3; 294/185; 294/188
(58) Field of Classification Search
    USPC .................. 294/64.3, 188, 213, 185; 901/40; 414/752.1, 941; 269/21
    See application file for complete search history.

(56) References Cited

U.S. PATENT DOCUMENTS

| 2,905,768 | A | * | 9/1959 | Cronquist | 360/230 |
| 5,077,888 | A | * | 1/1992 | Tokisue et al. | 29/467 |
| 7,063,499 | B2 | * | 6/2006 | Miyamoto | 414/744.8 |
| 7,607,647 | B2 | * | 10/2009 | Zhao et al. | 269/21 |
| 2006/0138793 | A1 | * | 6/2006 | Tanae et al. | 294/64.3 |
| 2008/0145190 | A1 | * | 6/2008 | Yassour et al. | 414/147 |
| 2010/0264679 | A1 | * | 10/2010 | Moriya | 294/64.1 |

* cited by examiner

*Primary Examiner* — Dean Kramer
(74) *Attorney, Agent, or Firm* — Pillsbury Winthrop Shaw Pittman LLP

(57) ABSTRACT

An apparatus configured to handle an object in a contactless manner, the apparatus includes a carrying body having a carrying surface which is configured to be directed towards the object, the carrying surface being provided with a plurality of traction members and a plurality of overpressure members, each overpressure member being provided with at least one exhaust opening, each traction member being provided with an indentation and at least two suction openings that are arranged in the indentation, the at least two suction openings of each traction member being configured to generate a pressure gradient between them so as to create a traction fluid flow in the indentation in a direction substantially parallel to the carrying surface; and a pressure controller configured to control the pressure gradient between the at least two suction openings of each traction member.

18 Claims, 7 Drawing Sheets

APPARATUS AND METHOD FOR CONTACTLESS HANDLING OF AN OBJECT

CROSS REFERENCE TO RELATED APPLICATIONS

This application claims priority and benefit under 35 U.S.C. §119(e) to U.S. Provisional Patent Application No. 61/333,439, entitled "Apparatus and Method For Contactless Handling Of An Object", filed on May 11, 2010. The content of that application is incorporated herein in its entirety by reference.

FIELD

The present invention relates to an apparatus for contactless handling of an object, a system comprising a lithographic apparatus and an apparatus for contactless handling of an object, and also to a method for contactless handling of an object.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

SUMMARY

It is desirable to improve contactless handling of an object, such as a substrate.

According to an embodiment of the invention, there is provided an apparatus arranged to handle an object in a contactless manner, such as a substrate, comprising a carrying body having a carrying surface which is configured to be directed towards the object, the carrying surface being provided with a plurality of traction members and a plurality of overpressure members, each overpressure member being provided with at least one exhaust opening, each traction member of the carrying surface being provided with an indentation and at least two suction openings being arranged in the indentation, the at least two suction openings of each traction member being configured to generate a pressure gradient between them so as to create a traction fluid flow in the indentation in a direction substantially parallel to the carrying surface. The apparatus further includes a pressure controller configured to control the pressure gradient between the at least two suction openings of each traction member.

In another embodiment of the invention, there is provided a system comprising a lithographic apparatus arranged to transfer a pattern from a patterning device onto a substrate, and an apparatus configured to handle an object in a contactless manner, such as a substrate, comprising a carrying body having a carrying surface which is configured to be directed towards the object, the carrying surface being provided with a plurality of traction members and a plurality of overpressure members, each overpressure member being provided with at least one exhaust opening, each traction member of the carrying surface being provided with an indentation and at least two suction openings being arranged in the indentation, the at least two suction openings of each traction member being configured to generate a pressure gradient between them so as to create a traction fluid flow in the indentation in a direction substantially parallel to the carrying surface, and a pressure controller configured to control the pressure gradient between the at least two suction openings of each traction member.

According to a further embodiment of the invention, there is provided a system comprising: a lithographic apparatus comprising an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, and an apparatus configured to handle an object in a contactless manner, such as a substrate, comprising a carrying body having a carrying surface which is configured to be directed towards the object, the carrying surface being provided with a plurality of traction members and a plurality of overpressure members, each overpressure member being provided with at least one exhaust opening, each traction member of the carrying surface being provided with an indentation and at least two suction openings being arranged in the indentation, the at least two suction openings of each traction member being configured to generate a pressure gradient between them so as to create a traction fluid flow in the indentation in a direction substantially parallel to the carrying surface, and also a pressure control system, which pressure control system is configured to control the pressure gradient between the at least two suction openings of each traction member.

According to a still further embodiment of the invention, there is provided a method for handling an object in a contactless manner, comprising: providing a carrying body having a carrying surface which is configured to be directed towards the object, the carrying surface being provided with a plurality of traction members and a plurality of overpressure members, each overpressure member being provided with at least one exhaust opening, each traction member of the carrying surface being provided with an indentation and at least two suction openings being arranged in the indentation, drawing in fluid through the at least two suction openings of each traction member, wherein a pressure gradient is generated between the at least two suction openings of each traction member so as to create a traction fluid flow in the indentation in a direction substantially parallel to the carrying surface.

According to an embodiment of the invention, there is provided a device manufacturing method comprising transferring a pattern from a patterning device onto a substrate, providing a carrying body having a carrying surface which is configured to be directed towards the substrate, the carrying surface being provided with a plurality of traction members and a plurality of overpressure members, each overpressure member being provided with at least one exhaust opening, each traction member of the carrying surface being provided with an indentation and at least two suction openings being arranged in the indentation, drawing in fluid through the at least two suction openings of each traction member, wherein a pressure gradient is generated between the at least two suction openings of each traction member so as to create a traction fluid flow in the indentation in a direction substantially parallel to the carrying surface, displacing the substrate by means of the carrying body to the patterning device.

According to an embodiment of the invention, there is provided a method for handling an object in a contactless manner using a carrying body having a carrying surface which is configured to be directed towards the object, the carrying surface being provided with a plurality of traction members and a plurality of overpressure members, each overpressure member being provided with at least one exhaust opening, each traction member of the carrying surface being provided with an indentation and at least two suction openings that are arranged in the indentation, the method comprising:

controlling a fluid flow in the indentation in a direction substantially parallel to the carrying surface through the at least two suction openings of each traction member by generating a pressure gradient between the at least two suction openings of each traction member.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
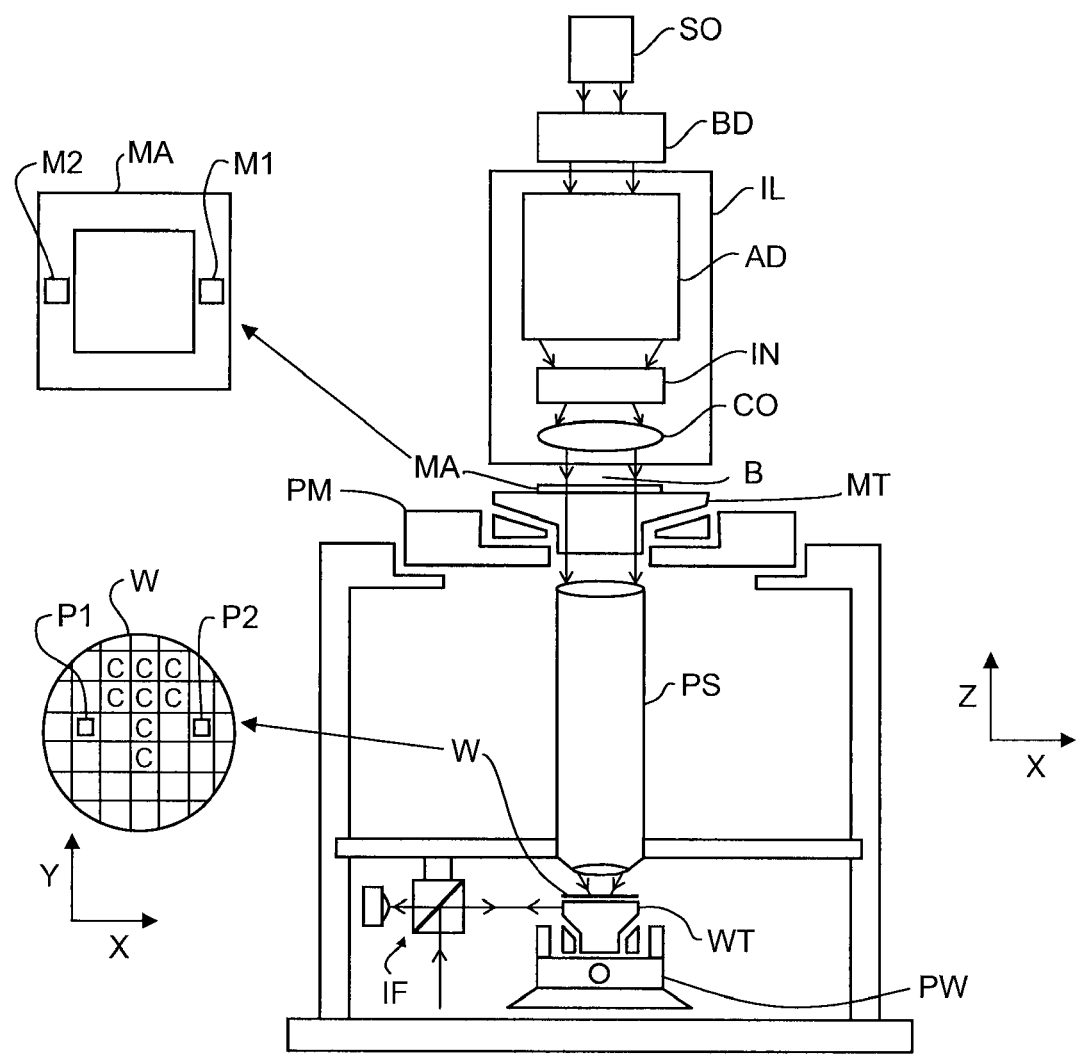
FIG. 1 shows a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports"

(and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as a-outer and a-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The substrate W has a top side which is provided with a layer of radiation-sensitive material (resist) and a bottom side opposite the top side. For installing a substrate W from a storage device onto the substrate table WT, it is known to use a gripper structure which is configured to engage onto the bottom side of the substrate. The substrate table WT is provided with extendable pins which can be displaced between a retracted position in the substrate table WT and an extended position protruding upwards from the substrate table WT. The gripper structure moves the substrate W from the storage device to the substrate table WT and lowers the substrate W onto the pins when they are in the extended position. With the substrate W transferred onto the pins, the gripper structure is subsequently removed and the pins are retracted to the retracted position so as to position the substrate W on the substrate table WT in an accurate manner.

The pins and grippers make physical contact with the substrate W. As a result, contamination is transferred to and from the substrate W. A transfer of contamination to the bottom side of the substrate W creates an overlay risk, because the substrate W may not be sufficiently flat when contaminated. In addition, physical contact of the pins and grippers with the substrate W results in a thermal load which will cause a transient thermal deformation of the substrate. This may lead to a non-reproducing grid distortion and overlay error. Also, the extendable pins in the substrate table WT form an undesired mass on the substrate table WT with the possibility of undesired resonances. During acceleration and for a period after acceleration, resonances from a flexible mass form a dynamic load on the substrate table WT. This affects servo accuracy and positioning accuracy.

Figure 2:
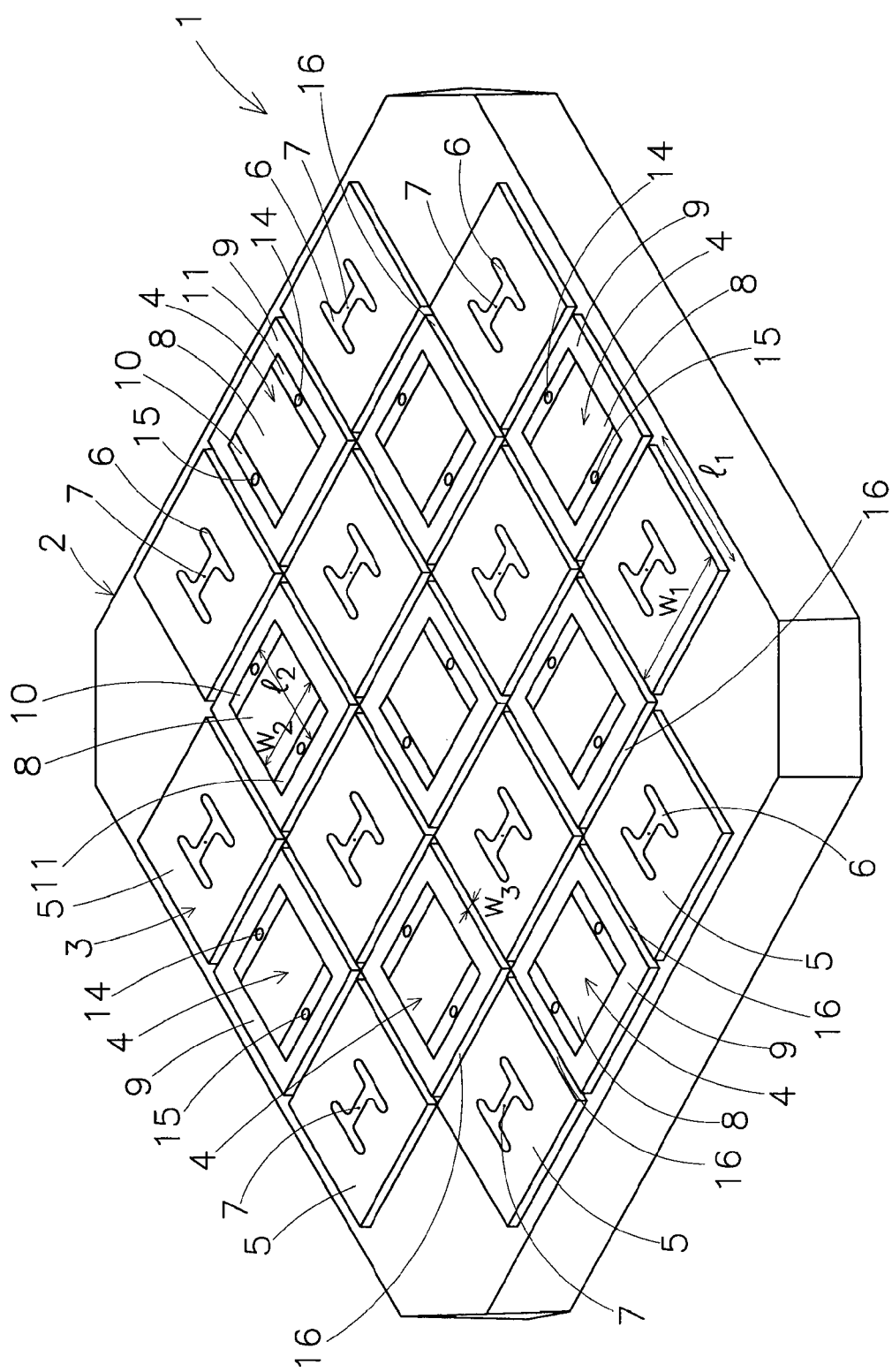
FIG. 2 shows a perspective view of an apparatus configured to contactless handle an object according to an embodiment of the invention.

In the exemplary embodiment of the invention, the substrate W is displaced from the storage device to the substrate table WF with an apparatus 1 configured to contactless handle of the substrate W. As schematically depicted in FIG. 2, the apparatus 1 configured to contactless handle the substrate W comprises a carrying body 2 having a carrying surface 3 which is configured to be directed towards the substrate W. The carrying surface 3 is defined by the upper surfaces of a plurality of traction members 4 and a plurality of overpressure members 5. The traction members 4 and the overpressure members 5 are arranged adjacent to each other in an alternating manner. In this exemplary embodiment, each traction member 4 and each overpressure member 5 has a quadrangular shape having a width dimension $w_1$ and a length dimension $l_1$. The width dimension $w_1$ is between about 2-35 mm and the length dimension $l_1$ is between about 2-35 mm, for example between about 8-15 mm, such as about 10 mm. In this exemplary embodiment, the overpressure members 5 and the traction members 4 each have a square shape. However, they may also have a different quadrangular shape, for example a rectangular shape.

Each overpressure member 5 comprises a H-shaped indentation 6. The H-shaped indentation 6 has a depth dimension, as seen in a direction substantially perpendicular to the carrying surface 3, which is less than about 100 μm, for example less than about 20 μm, such as 10 about μm (see also FIG. 3a). Each overpressure member 5 is provided with at least one exhaust opening 7. The exhaust openings 7 are arranged in the H-shaped indentations 6. Each exhaust opening 7 is, for example, a bore having a diameter between about 0.05-1 mm. Although in this exemplary embodiment, each overpressure member 5 comprises only one exhaust opening 7, it is possible for each overpressure member 5 to comprise any number of exhaust openings 7. The exhaust openings 7 of the overpressure members 5 are configured to discharge a fluid flow which is directed away from the carrying surface 3. This produces a bearing force on the substrate W which can be adjusted by controlling the fluid flow from the exhaust openings 7. In this exemplary embodiment, the exhaust openings 7 are configured to blow out fluid in a direction substantially transversely to the carrying surface 3. The fluid is distributed within the H-shaped indentation 6 which results in a uniform bearing force and a large bearing stiffness.

Each exhaust opening 7 of each overpressure member 5 can be provided with a flow restriction member. The flow restriction member can be constructed in various ways. In the exemplary embodiment shown in FIG. 3b, the flow restriction member comprises a narrowed hole. For example, the narrowed hole has a diameter of about 0.10-0.20 mm and a length of about 8-12 mm, such as a diameter of about 0.16 mm and a length of about 10 mm. The narrowed hole forms a capillary resistance. FIG. 3c shows an alternative embodiment, in which the flow restriction member comprises a porous body which defines at least a portion of the carrying surface 3 of the overpressure member 5. The porous body influences the flow from the exhaust opening 7 to the carrying surface 3. As a result of the flow restriction members, the temperature stability over the carrying surface 3 is improved.

Each traction member 4 is provided with an indentation 8. In this exemplary embodiment, the indentations 8 each have a square shape. However, they may also have a different quadrangular shape, for example a rectangular shape. The indentation 8 has a width dimension $w_2$ and a length dimension $l_2$, the width dimension $w_2$ being between about 0.2-0.9 of the width dimension $w_1$ of the traction member 4 and the length dimension $l_2$ being between about 0.2-0.9 of the length dimension $l_1$ of the traction member 4. For example, the width dimension $w_2$ is about 0.7 of the width dimension $w_1$ of the traction member 4, and the length dimension $l_2$ is about 0.7 of the length dimension $l_1$ of the traction member 4. Each indentation 8 has a depth dimension, as seen in a direction perpendicular to the carrying surface 3, which is, for example, between about 1-400 μm, such as about 40 μm. The indentation 8 further comprises at least two recessed slots 10,11 at opposite sides of the indentation 8. For example, the slots 10,11 each have a depth dimention, as seen in a direction substantially perpendicular to the carrying surface 3, which is less than about 2 mm, such as less than about 40 μm. Each indentation 8 is surrounded by a circumferential wall 9 which surrounds the indentation 8. The upper surfaces of the circumferential walls 9 define the carrying surface 3 at the location of the traction members 4. The recessed slots 10,11 in the indentation 8 adjoin the circumferential wall 9 of each traction member 4.

In this exemplary embodiment, each traction member 4 is provided with two suction openings 14,15. However, it is possible for each traction member 4 to comprise any number of suction openings. The suction openings 14,15 are arranged in the indentation 8. In this exemplary embodiment, the suction openings 14,15 are arranged in the recessed slots 10, 11, respectively. The suction openings 14,15 of each traction member 4 are configured to generate a pressure gradient between them so as to create a traction fluid flow in the indentation 8 in a direction substantially parallel to the carrying surface 3 (see also FIG. 3). To this end, a pressure controller is provided, which is configured to control the pressure gradient between the suction openings 14,15 of each traction member 4.

The traction force exerted on the substrate W can be controlled by controlling the pressure gradient between the suction openings 14,15 of each traction member 4. For example, the pressure gradient can be controlled in each traction member 4 independently from the pressure gradients in the other pressure members 5. However, it is also possible to control the pressure gradients in a group of traction members 4 independently from the pressure gradients in the other traction members 4 or from the pressure gradients in another group of traction members 4. As a result, the substrate W can be displaced and moved in a controllable manner.

The pressure controller can be constructed in various ways. In this exemplary embodiment, the pressure controller comprises at least one suction pump and a fluid channel system which connects the suction openings 14,15 of the traction members 4 to the suction pump. For example, the fluid channel system comprises internal passages which are arranged within the carrying body 2. The suction openings 14,15 of each traction member 4 are connected by means of the fluid channel system to the suction pump so as to generate the pressure gradients between the at least two suction openings 14,15 of each traction member 4.

For example, the suction openings 14 of the traction members 4 are connected to the suction pump by means of a first control valve, wherein the suction openings 15 of the traction members 4 are connected to the suction pump by means of a second control valve. The first and second control valves can be controlled such that the underpressure in one of the suction openings 14,15 of each traction member 4 is different from the underpressure in the other suction opening 14,15 of said each traction member 4. Alternatively, the fluid channel system may be provided with suction passages extending from the suction openings 14,15 and differential control valves which are configured to control the pressure differences between the suction passages associated with suction openings 14,15 of each traction member 4.

In addition, the pressure control system can also be configured to control the fluid flow which is discharged from the exhaust openings 7 of the overpressure members 5.

The traction members 4 and the overpressure members 5 are separated from each other by grooves 16 which are arranged in the carrying surface 3. The grooves 16 in the carrying surface 3 constitute a grid of channel sections. For example, the grooves 16 each have a width dimension $w_3$ between about 0.4-4 mm, such as about 1 mm. Also, the grooves 16 can each have a depth dimension, as seen in a direction substantially perpendicular to the carrying surface 3, between about 0.4-4 mm, such as 1 mm. For example, the grooves 16 are square or rectangular in cross-section. The grooves 16 prevent the flow fields of each suction member 4 and each overpressure member 5 from interacting with the flow fields of adjacent suction members 4 and overpressure members 5. This improves accurate control during manipulation of the substrate W.

In use, the substrate W is carried by the carrying surface 3 in a contactless manner. The exhaust openings 7 discharge a fluid which impinges onto the substrate W. This provides a bearing force which prevents the substrate W from contacting the carrying surface 3. The temperature of the discharged fluid is, for example, between about 300-1000° C. For example, the pressure in the exhaust opening 7 of each overpressure member 5 is between about 10 Pa and about 5 bar absolute pressure, such as about 2.2 bar absolute pressure. With the pressure control system, the suction openings 14,15 of each traction member 4 provide two different underpressures relative to the ambient pressure. For example, the average pressure in the suction openings 14,15 of each traction member 4 is between about 2 Pa and about 0.9 bar absolute pressure, such as about 0.5 bar absolute pressure. The pressure gradient between the suction openings 14,15 of each traction member 4 is smaller than about 0.9 bar, such as about 0.6 bar. The circumferential wall 9 defining the carrying surface 3 allows a leak flow into the indentation 8 (indicated by arrows in FIG. 3). Thus, fluid is sucked into the gap between the substrate W and the indentations 8 and drawn into the suction openings 14,15 of each traction member 4. As a result of the different underpressures, the mass flow through the one suction opening 14 is greater than the mass flow through the other suction opening 15. This leads to a fluid traction flow in the indentation 8 in the direction substantially parallel to the carrying surface 3. The traction flow will produce a traction force exerted on the substrate W by means of fluid friction. No fluid is exhausted from the carrying body 2 at the traction members 4. The fluid is discharged from the carrying body 2 through the exhaust openings 7 of the overpressure members 5 only. As a result of the overpressure members 5 on the one hand, and the traction members 4 provided with at least two suction openings 14,15 and without any discharge openings on the other hand, it is possible for the substrate W to be clamped tightly. For example, the stiffness of the clamping force may be 0.5 bar per 10 μm gap height over the carrying surface 3. The clamping force applied to the substrate W can be sufficient to substantially flatten the substrate W before the substrate W is mounted onto the substrate table WF.

With the apparatus 1 shown in FIGS. 2 and 3, the substrate W can be displaced from a storage device for substrates (not shown) to the substrate table WF of the lithographic apparatus in a contactless manner. This is depicted schematically by arrows A in FIG. 5. In addition, the substrate W can be translated and rotated about its central axis (see arrows B in FIG. 5). The substrate W can be rotated by the traction members 4 while the substrate W is being transferred from the storage device the lithographic device so as to achieve a uniform temperature over the surface of the substrate W.

In this exemplary embodiment, the carrying surface 3 engages the substrate W on the top side which is provided with a layer of radiation-sensitive material (resist). It is possible to clamp the substrate W from the resist side, because the carrying surface 3 makes no physical contact with the resist. Thus, the substrate W is suspended from the carrying surface 3. However, the substrate W may also be floating above the carrying surface 3 (in the position shown in FIG. 2), wherein the carrying surface 3 adjoins the bottom side of the substrate W which is not provided with a layer of radiation-sensitive material.

Figure 5:
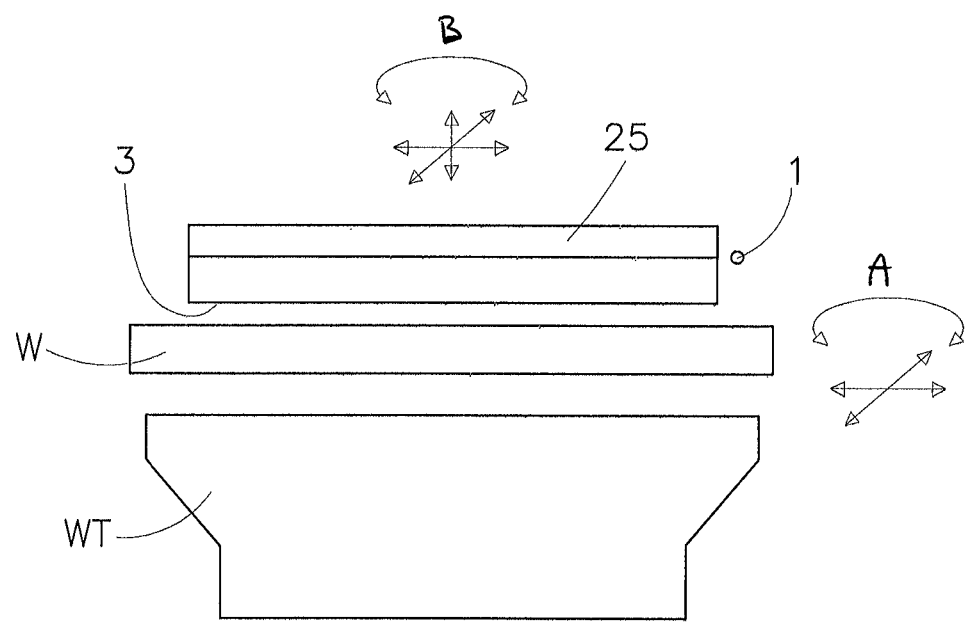
FIG. 5 shows the apparatus for contactless handling of an object shown in FIG. 2 which can be used with the lithographic apparatus shown in FIG. 1.

As shown in FIG. 5, the apparatus 1 configured to contactless handle the substrate W may be provided with a thermal conditioning member 25, such as a thermal plate, which is configured to condition the apparatus 1 at a predefined temperature. The thermal conditioning member 25 is arranged on the side of the carrying body 2 which is remote from the carrying surface 3.

Figure 6:
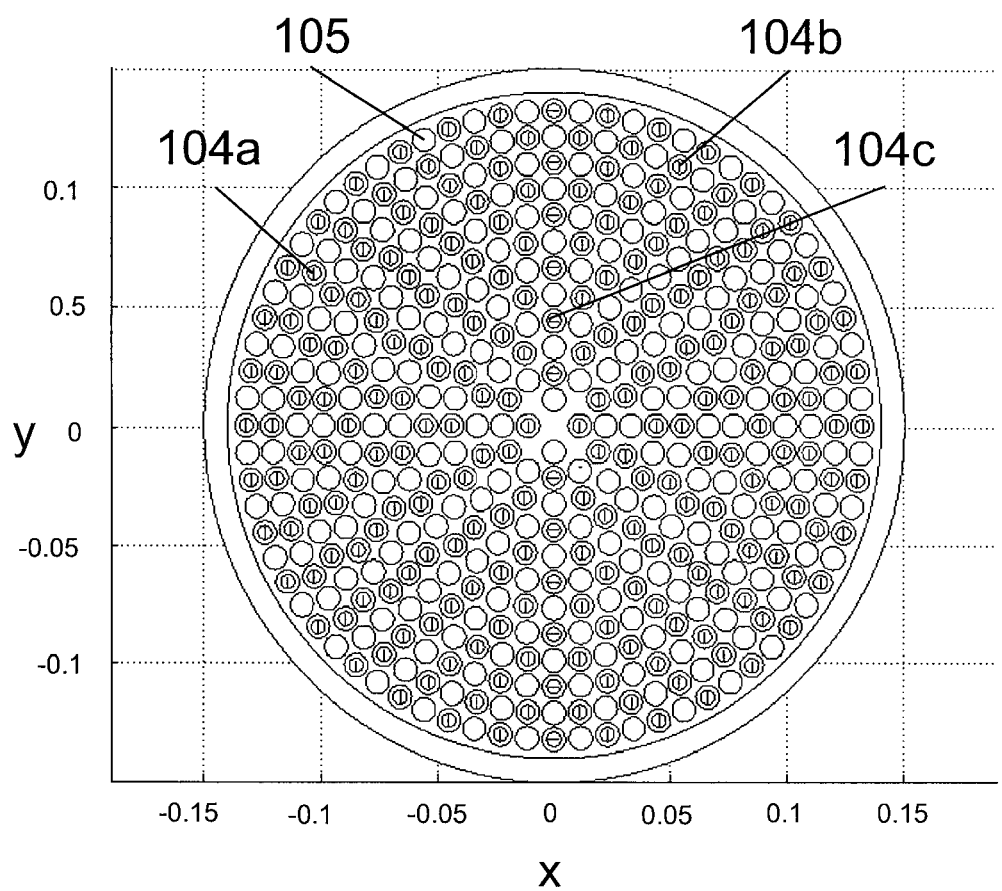
FIG. 6 shows a top view of an apparatus configured to contactless handle an object according to an embodiment of the invention.

In an alternative embodiment, each traction member 104 and each overpressure member 105 has a substantially circular shape as shown in FIG. 6. In this embodiment four groups of cells, namely: a group of overpressure members 105 to provide stiffness, a first group of traction members 104a to provide Y traction and Rz-traction in a clockwise-direction, a second group of traction members 104b to provide Y-traction and Rz-traction in a counter clockwise-direction and a third group of traction members 104c to provide X-traction are distributed over the carrying surface. In this embodiment the distribution of the traction members (104a, 104b and 104c) is constructed and arranged to form different groups which are relatively easy to manufacture and to control. At the edge of the carrying surface 3 the overpressure members 105 and the traction members 104 are evenly distributed to provide a flat surface of the wafer. In a preferred embodiment the overpressure members 105 and traction members 104a, 104b and 104c are distributed over the carrying surface according to a 50%, 20%, 20% and 10% distribution respectively, wherein the overpressure members 105 and traction members 104 are evenly distributed over the carrying surface 3 to obtain a flat wafer surface. As, in this example, the required velocity in the X-direction is smaller than the required velocity in the Y-direction, the number of Y/Rz-traction members 104a, 104b is, in this example, higher than the number of X-traction members 104c.

Figure 7:
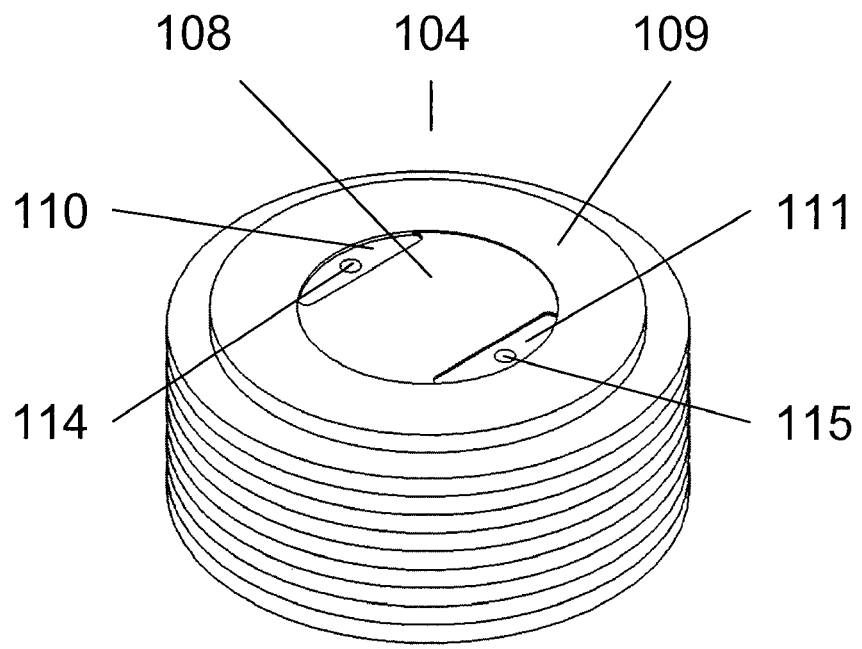
FIG. 7 shows a perspective view of a traction member of the apparatus shown in FIG. 6.
Figure 8:
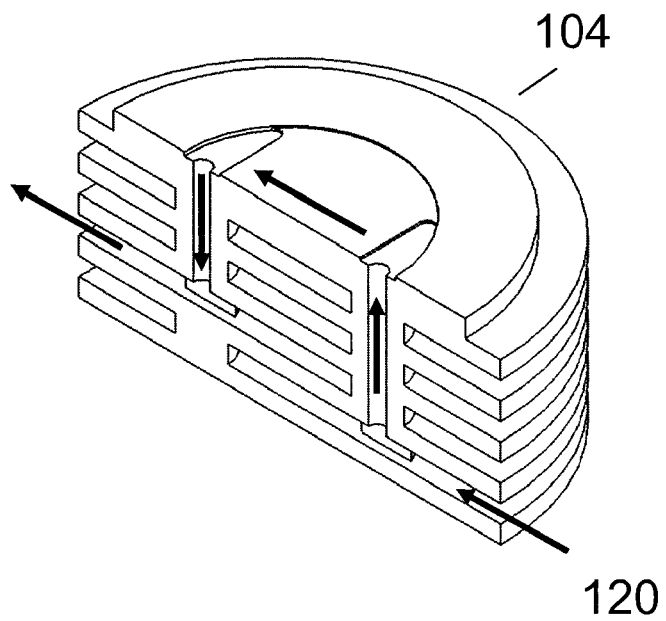
FIG. 8 shows a cross-sectional view of a traction member shown in FIG. 7.

As shown in FIG. 7, each traction member 104 is provided with an indentation 108. In this embodiment the indentations 108 each have a substantially circular shape. The indentation 108 has a diameter, which is, for example, between 2-10 mm such as about 6 mm. Each indentation has a depth dimension as seen in a direction perpendicular to the carrying surface 3, which is, for example, between 1-400 µm, such as about 12 µm. The indentation 108 further comprises at least two recessed slots 110, 111 at opposite sides of the indentation 108. For example, the recessed slots 110, 111 each have a depth dimension, as seen in a direction substantially perpendicular to the carrying surface 3, which is less than about 2 mm, such as less than 40 µm. Each indentation 108 is surrounded by a circumferential wall 109 which surrounds the indentation 108. The upper surfaces of the circumferential walls 9 define the carrying surface 3 at the location of the traction members 104. The circumferential wall 109 further prevents crosstalk from the neighboring traction members 104 and overpressure members 105. In this embodiment the traction members 104 and the overpressure members 105 are further separated from each other by grooves 16 which are arranged in the carrying surface 3 and which may be connected to atmospheric pressure to provide further isolation between the members in the carrying surface 3. For example, the grooves 16 each have a width between about 0.4-4 mm, such as about 1 mm. Also, the grooves 16 can each a depth dimension, as seen in a direction substantially perpendicular to the carrying surface 3, between about 0.4-4 mm, such as 1 mm. In this embodiment, each traction member 104 is provided with two independent suction openings 114, 115. However, it is possible for each traction member 104 to comprise any number of suction openings. FIG. 8 shows a cross-section of FIG. 7 and indicates by the arrows 120 how each traction member 104, for example, is constructed to generate a pressure gradient between the suction openings 114, 115 so as to create a traction fluid flow in the indentation 108 in a direction substantially parallel to the carrying surface 3. As explained, the traction force exerted on the substrate W can be controlled by controlling the pressure gradient between the suction openings 114, 115 of each traction member 104.

Figure 3A:
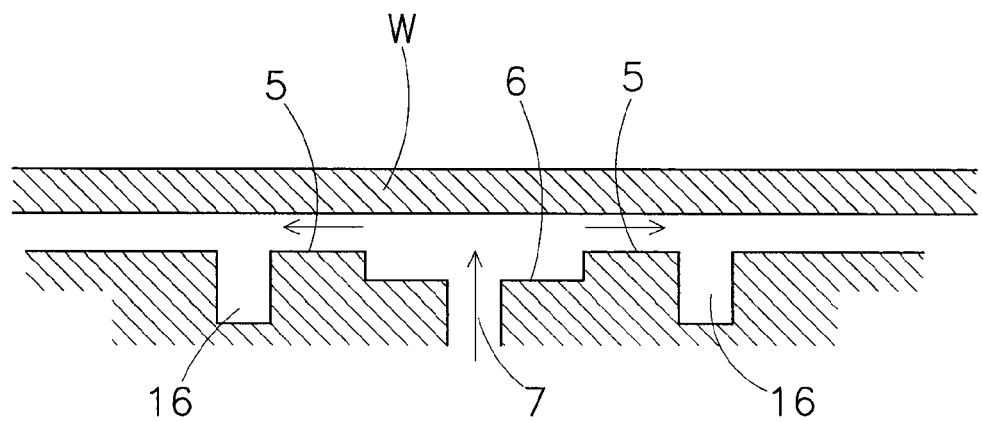
FIG. 3a-3c show cross-sectional views of an overpressure member of the apparatus shown in FIG. 2.
Figure 3B:
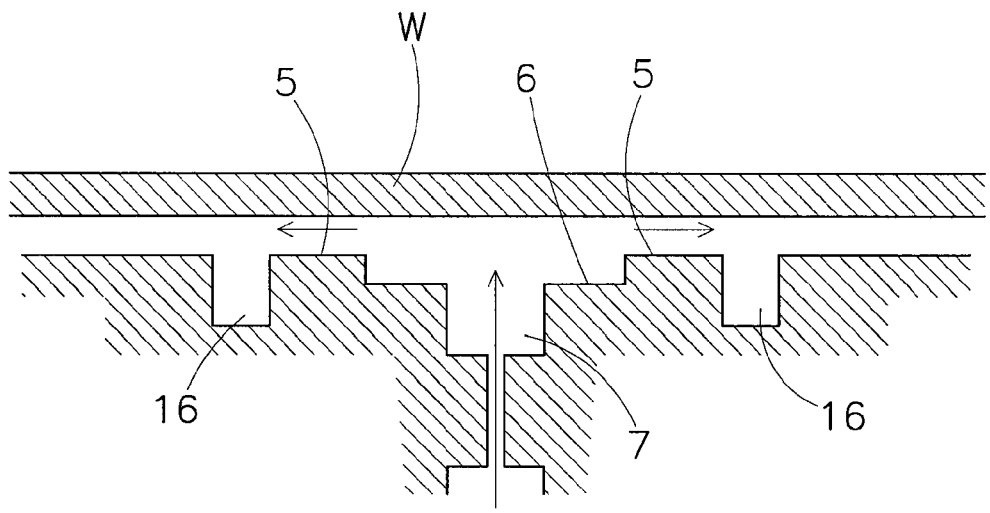
Figure 3C:
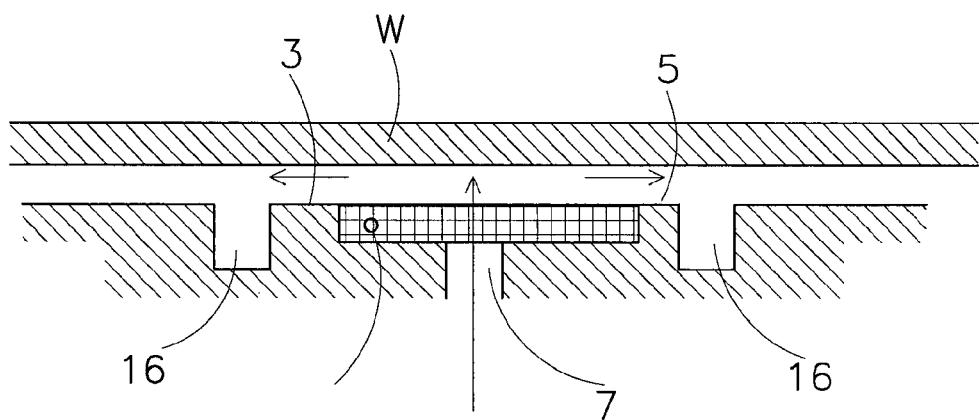
Figure 4:
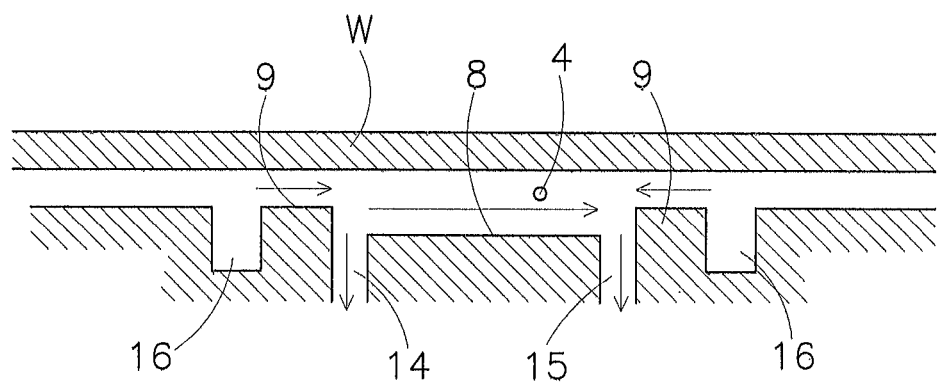
FIG. 4 shows a cross-sectional view of a traction member of the apparatus shown in FIG. 2.
Figure 9:
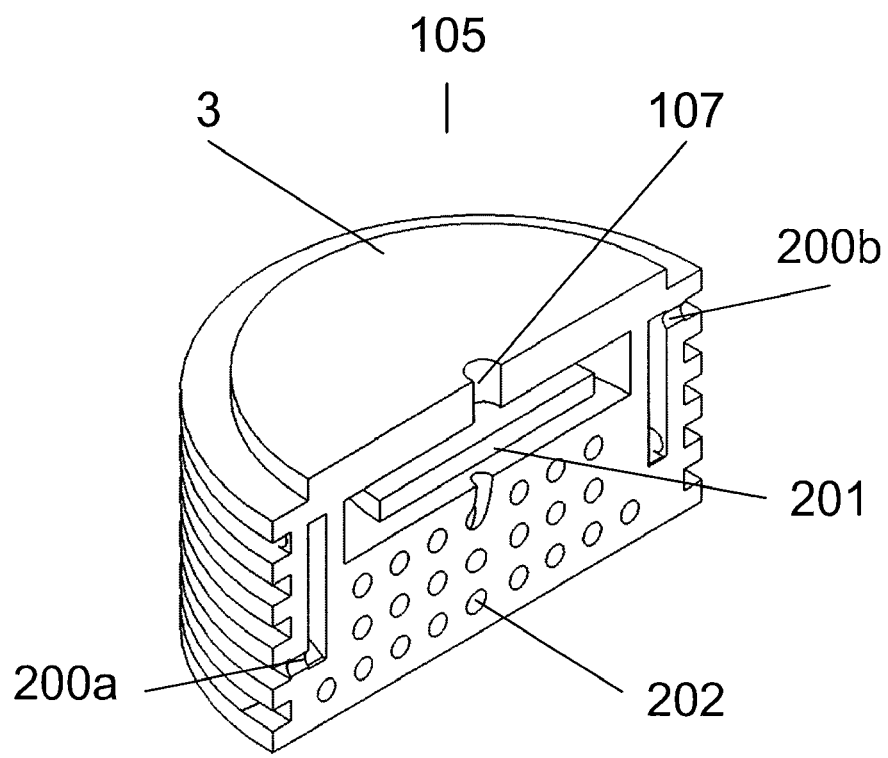
FIG. 9 shows a cross section of a perspective view of an overpressure member of the apparatus shown in FIG. 6.
Figure 10:
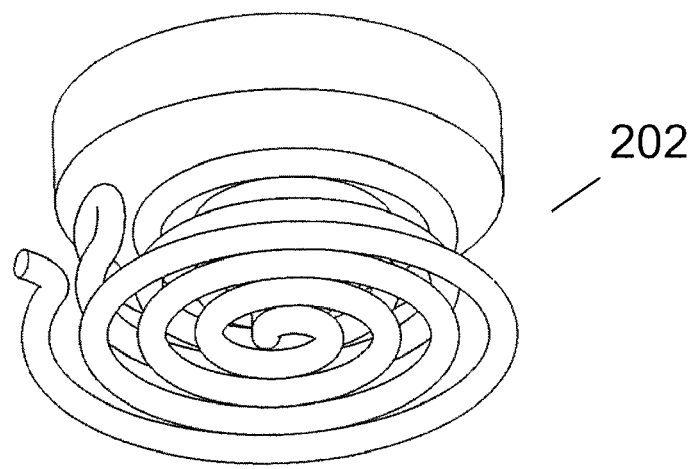
FIG. 10 shows a long spiral channel to improve the thermal conditioning of the overpressure member shown in FIG. 9.

FIG. 9 shows a further embodiment of an overpressure member 105 as an example of the overpressure members as schematically shown in FIGS. 3a, 3b and 3c. Each overpressure member is provided with at least one exhaust opening 107. Each exhaust opening 107 is, for example a bore having a diameter between about 0.05-1 mm such as about 0.2 mm. Although in this exemplary embodiment, each overpressure member comprises only one exhaust opening 107, it is possible for each overpressure member 105 to comprise any number of exhaust openings 107. The exhaust openings 107 of the overpressure members 105 are configured to discharge a first fluid flow which is directed away from the carrying surface 3, providing a bearing force on the substrate W and which can be adjusted by controlling the pressure of the first fluid flow from the exhaust openings 107. The flow resistance of the exhaust opening 107 and the flow resistance between the exhaust opening 107 and the substrate W determine the total flow resistance and accordingly the bearing force which prevents the substrate W from contacting the carrying surface 3. In this embodiment the overpressure member 105 is further provided with a second fluid inlet opening 200a and a corresponding second fluid outlet opening 200b as to form a second fluid structure constructed and arranged to provide a second fluid into overpressure member 105. As an example, temperature controlled water can be provided in the second fluid structure for temperature conditioning of the overpressure member 105 as such and accordingly to control the temperature of the first fluid flow which is directed away from the carrying surface 3, via the exhaust openings 107, to further improve the thermal conditioning of the wafer W. FIG. 10 is a cross-section of FIG. 9 and shows a detail of a further preferred embodiment, wherein the first fluid flow is guided through a long spiral channel as to provide a substantially thermally neutral exhaust system to improve the thermal conditioning of the first fluid. In a further embodiment the overpressure member comprises a porous body 201 which defines at least a portion of the carrying surface 3 of the overpressure member 105. As the porous body 201 is conditioned by the second fluid, the flow from the exhaust opening 107 to the carrying surface is even further temperature stabilized.

A method according to an embodiment of the invention for contactless handling of an object, comprises:
   providing a carrying body having a carrying surface which is configured to be directed towards the object, the carrying surface being provided with a plurality of traction members and a plurality of overpressure members, each overpressure member being provided with at least one exhaust opening, each traction member of the carrying surface being provided with an indentation and at least two suction openings being arranged in the indentation,
   drawing in fluid through the at least two suction openings of each traction member, wherein a pressure gradient is generated between the at least two suction openings of each traction member so as to create a traction fluid flow in the indentation in a direction substantially parallel to the carrying surface.

In particular in the method according to an embodiment the invention, the pressure gradient between the at least two suction openings of each traction member is controlled.

According to a method according to an embodiment of the invention, the pressure in the exhaust opening of each overpressure member is between about 10 Pa and about 5 bar absolute pressure, such as about 2.2 bar absolute pressure.

According to a method of an embodiment of the invention, the pressure in the at least two suction openings of each traction member is between about 2 Pa and about 0.9 bar absolute pressure, such as about 0.5 bar absolute pressure.

According to a method of an embodiment of the invention, the maximum pressure gradient between the at least two suction openings of each traction member is smaller than about 0.9 bar, such as about 0.6 bar.

According to a method of an embodiment of the invention, the object is a substrate comprising a top side which is provided with a layer of radiation-sensitive material and a bottom side which is not provided with a layer of radiation-sensitive material, and wherein the carrying surface engages the substrate on the top side.

A method according to an embodiment of the invention provides for a fluid that is discharged from the carrying body only through the exhaust openings of the overpressure members.

A device manufacturing method according to an embodiment of the invention for transferring a pattern from a patterning device onto a substrate, comprises:
   providing a carrying body having a carrying surface which is configured to be directed towards the substrate, the carrying surface being provided with a plurality of traction members and a plurality of overpressure members, each overpressure member being provided with at least one exhaust opening, each traction member of the carrying surface being provided with an indentation and at least two suction openings being arranged in the indentation,
   drawing in fluid through the at least two suction openings of each traction member, wherein a pressure gradient is generated between the at least two suction openings of each traction member so as to create a traction fluid flow in the indentation in a direction substantially parallel to the carrying surface, displacing the substrate by means of the carrying body to the patterning device.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. An apparatus configured to handle an object in a contactless manner, the apparatus comprising:
    a carrying body having a carrying surface which is configured to be directed towards the object, the carrying surface being provided with a plurality of traction members and a plurality of overpressure members, each overpressure member being provided with at least one exhaust opening, each traction member being provided with an indentation and at least two suction openings that are arranged in the indentation, the at least two suction openings of each traction member being configured to generate a pressure gradient between them so as to create a traction fluid flow in the indentation in a direction substantially parallel to the carrying surface;
    a pressure controller configured to control the pressure gradient between the at least two suction openings of each traction member, and
    a control valve arrangement coupled to the at least two suction openings, the control valve arrangement controlled by the pressure controller to establish the pressure gradient between the at least two suction openings.

2. The apparatus of claim 1, wherein the pressure controller comprises at least one suction pump and a fluid channel system which connects the suction openings of the traction members to the suction pump.

3. The apparatus of claim 1, wherein the pressure controller is configured to control a fluid flow which is discharged from the exhaust openings.

4. The apparatus of claim 1, wherein the traction members and the overpressure members are arranged next to each other in an alternating manner.

5. The apparatus of claim 4, wherein the traction members and the overpressure members are separated from each other by grooves which are arranged in the carrying surface.

6. The apparatus of claim 1, wherein each overpressure member and each traction member has a quadrangular shape having a width dimension and a length dimension, the width dimension being between about 2-35 mm and the length dimension being between about 2-35 mm.

7. The apparatus of claim 6, wherein the indentation has a substantially quadrangular shape having a width dimension and a length dimension, the width dimension of the indentation being between about 0.2-0.9 of the width dimension of the traction member, and the length dimension of the indentation being between about 0.2-0.9 of the length dimension of the traction member.

8. The apparatus of claim 1, wherein the indentation has a depth dimension that is between about 1-400 μm.

9. The apparatus of claim 1, wherein each traction member comprises a circumferential wall which surrounds the indentation, and wherein the circumferential wall is configured to allow a leak flow into the indentation.

10. The apparatus of claim 1, comprising a thermal conditioning member which is configured to thermally condition the apparatus.

11. The apparatus of claim 1, wherein the control valve arrangement comprises differential control valves to control the pressure gradient between the at least two suction openings.

12. The apparatus of claim 1, wherein the control valve arrangement comprises a first control valve coupled to one of the at least two openings and a second control valve coupled to another one of the at least two openings, the first and second control valves controlled so that an underpressure in said one of the at least two openings is different from an underpressure in said other one of the at least two openings.

13. An apparatus configured to handle an object in a contactless manner, the apparatus comprising;
    a carrying body having a carrying surface which is configured to be directed towards the object, the carrying surface being provided with a plurality of traction members and a plurality of overpressure members, each overpressure member being provided with at least one exhaust opening, each traction member being provided with an indentation and at least two suction openings that are arranged in the indentation, the at least two suction openings of each traction member being configured to generate a pressure gradient between them so as to create a traction fluid flow in the indentation in a direction substantially parallel to the carrying surface; and a pressure controller configured to control the pressure gradient between the at least two suction openings of each traction member, wherein the indentation comprises at least two recessed slots at opposite sides of the indentation, and wherein the at least two suction openings are arranged in the recessed slots, respectively.

14. An apparatus configured to handle an object in a contactless manner, the apparatus comprising:

a carrying body having a carrying surface which is configured to be directed towards the object, the carrying surface being provided with a plurality of traction members and a plurality of overpressure members, each overpressure member being provided with at least one exhaust opening, each traction member being provided with an indentation and at least two suction openings that are arranged in the indentation, the at least two suction openings of each traction member being configured to generate a pressure gradient between them so as to create a traction fluid flow in the indentation in a direction substantially parallel to the carrying surface; and a pressure controller configured to control the pressure gradient between the at least two suction openings of each traction member, wherein each overpressure member comprises a H-shaped indentation, which has a depth dimension which is less than about 100 µm, and wherein the exhaust opening of the overpressure member is arranged in the H-shaped indentation.

15. A method for handling an object in a contactless manner using a carrying body having a carrying surface which is configured to be directed towards the object, the carrying surface being provided with a plurality of traction members and a plurality of overpressure members, each overpressure member being provided with at least one exhaust opening, each traction member of the carrying surface being provided with an indentation and at least two suction openings that are arranged in the indentation, the method comprising:

controlling a fluid flow in the indentation in a direction substantially parallel to the carrying surface through the at least two suction openings of each traction member using a control valve arrangement coupled to the at least two suction openings by generating a pressure gradient between the at least two suction openings of each traction member, the control valve arrangement controlled to establish the pressure gradient between the at least two suction openings.

16. An apparatus configured to handle an object in a contactless manner, the apparatus comprising:

a carrying body having a carrying surface which is configured to be directed towards the object, the carrying surface being provided with a plurality of traction members and a plurality of overpressure members, each overpressure member being provided with at least one exhaust opening, each traction member being provided with an indentation and at least two suction openings that are arranged in the indentation, the at least two suction openings of each traction member being configured to generate a pressure gradient between them so as to create a traction fluid flow in the indentation in a direction substantially parallel to the carrying surface;

a pressure controller configured to control the pressure gradient between the at least two suction openings of each traction member, and a plurality of grooves arranged in the carrying surface that separate each of the traction members from adjacent overpressure members.

17. A system comprising:

a lithographic apparatus arranged to transfer a pattern from a patterning device onto a substrate, and an apparatus configured to handle an object in a contactless manner, the apparatus comprising a carrying body having a carrying surface which is configured to be directed towards the object, the carrying surface being provided with a plurality of traction members and a plurality of overpressure members, each overpressure member being provided with at least one exhaust opening, each traction member being provided with an indentation and at least two suction openings that are arranged in the indentation, the at least two suction openings of each traction member being configured to generate a pressure gradient between them so as to create a traction fluid flow in the indentation in a direction substantially parallel to the carrying surface;

a pressure controller configured to control the pressure gradient between the at least two suction openings of each traction member, and a control valve arrangement coupled to the at least two suction openings, the control valve arrangement controlled by the pressure controller to establish the pressure gradient between the at least two suction openings.

18. A system comprising:

a lithographic apparatus comprising a support constructed to support a patterning device, the patterning device being capable of imparting a radiation beam with a pattern in its cross-section to form a patterned radiation beam;

a substrate table constructed to hold a substrate;

a projection system configured to project the patterned radiation beam onto a target portion of the substrate; and an apparatus configured to handle an object in a contactless manner, the apparatus comprising a carrying body having a carrying surface which is configured to be directed towards the object, the carrying surface being provided with a plurality of traction members and a plurality of overpressure members, each overpressure member being provided with at least one exhaust opening, each traction member being provided with an indentation and at least two suction openings that are arranged in the indentation, the at least two suction openings of each traction member being configured to generate a pressure gradient between them so as to create a traction fluid flow in the indentation in a direction substantially parallel to the carrying surface;

a pressure controller configured to control the pressure gradient between the at least two suction openings of each traction member, and a control valve arrangement coupled to the at least two suction openings, the control valve arrangement controlled by the pressure controller to establish the pressure gradient between the at least two suction openings.

* * * * *